United States Patent
Yanagi

[11] Patent Number: 5,313,417
[45] Date of Patent: May 17, 1994

[54] SEMICONDUCTOR MEMORY DEVICE

[75] Inventor: Masahiko Yanagi, Tenri, Japan

[73] Assignee: Sharp Kabushiki Kaisha, Osaka, Japan

[21] Appl. No.: 117,737

[22] Filed: Sep. 8, 1993

Related U.S. Application Data

[62] Division of Ser. No. 733,685, Jul. 22, 1991, abandoned.

[30] Foreign Application Priority Data

Jul. 25, 1990 [JP] Japan .................. 2-196562

[51] Int. Cl.$^5$ ............... H01L 29/78; H01L 21/90; H01L 21/88
[52] U.S. Cl. ................... 365/52; 437/189; 437/190; 437/228; 427/534
[58] Field of Search .......... 365/52; 357/71, 68, 357/23.5; 437/228

[56] References Cited

U.S. PATENT DOCUMENTS

| | | | |
|---|---|---|---|
| 4,775,550 | 10/1988 | Chu et al. | 437/228 |
| 4,894,351 | 1/1990 | Batty | 437/228 |
| 4,965,226 | 10/1990 | Gootzen et al. | 437/228 |
| 4,970,177 | 11/1990 | Mizushima | 437/228 |

FOREIGN PATENT DOCUMENTS

| | | |
|---|---|---|
| 62-42460 | 2/1987 | Japan . |
| 63-302537 | 12/1988 | Japan . |
| 1-248537 | 1/1989 | Japan . |
| 2-1912 | 1/1990 | Japan . |
| 3-34323 | 2/1991 | Japan . |
| 3-293728 | 12/1991 | Japan . |

Primary Examiner—Eugene R. LaRoche
Assistant Examiner—Viet Q. Nguyen
Attorney, Agent, or Firm—Nixon & Vanderhye

[57] ABSTRACT

A semiconductor memory device including a substrate on which a memory cell array portion and a peripheral circuit portion for the memory cell array portion are provided, the surface of the memory cell array portion being higher than the surface of the peripheral circuit portion. A glass layer is formed on the peripheral circuit portion with the glass layer having a predetermined thickness for offsetting the difference in height between the surface of the memory cell array portion and that of the peripheral circuit portion, so as to provide a substantially even surface over the memory cell array portion and the peripheral circuit portion. A metal wiring for the memory cell array portion and the peripheral circuit portion is formed in a predetermined pattern on the substantially even surface.

4 Claims, 2 Drawing Sheets

SEMICONDUCTOR MEMORY DEVICE

This is a division of application Ser. No. 07/733,685, filed Jul. 22, 1991, now abandoned.

BACKGROUND OF THE INVENTION

1. Field of the Invention

The present invention relates to a semiconductor memory device (such as DRAM and SRAM) comprising a memory cell array potion and a peripheral circuit portion.

2. Description of the Related Art

As higher-density and larger-scale integration is pursued in an LSI memory, the structure thereof has tended to extend in three dimensions. Accordingly, the height of its memory cell array portion has increased, resulting in a greater difference in level between the memory cell array portion and the peripheral circuit portion including a decoder, a sense amplifier, and an input-output buffer. The difference in height leads to an uneven surface, which may cause problems in the fine processing of wires installed over the memory cell array portion and peripheral circuit portion, such as the breaking of a wire or the increase in resistance value due to the non-uniform width of a wire.

In order to reduce the difference in level mentioned above, the prior art has adopted a method in which the surface of a predetermined region of the substrate is previously removed to form a hollow portion for the memory cell array portion (e.g. Japanese Unexamined Patent Publication Nos. SHO 63-266866(1988) and SHO 63-132471(1988)). The conventional method will be described below.

First, as shown in FIG. 2A, the region of the substrate for the peripheral circuit portion is masked with a layer of $Si_3N_4$, so as to exclusively oxidize the region of the substrate for the memory cell array portion by thermal oxidization.

In the drawing, the substrate 1 of Si and a layer 2 of $SiO_2$ are shown. The $SiO_2$ layer 2 is subsequently removed in a HF solution, so that a hollow portion for the memory cell array portion can be formed in the substrate (FIG. 2B). After the formation of a memory cell array on the hollow portion and transistors in the peripheral circuit portion, the memory cell array portion and the peripheral circuit portion are coated with a BPSG layer which is then heat-treated to provide an ever surface (FIG. 2C). In FIG. 2C, the difference in level $d_2$ before the wiring step and a layer 3 of BPSG are shown. Thereafter, the metal wiring 4 is provided on the BPSG layer as shown in FIG. 2D.

The method, however, is disadvantageous in that the substrate is damaged through the formation of the hollow portion. That is, the local growth of the $SiO_2$ layer 2 for the hollow portion causes great stress in the Si substrate during the oxidization treatment. As a result, there were some cases where the operation as a memory device was adversely affected. Moreover, a on period of treatment is required to obtain a sufficiently deep hollow portion, which is not appropriate for mass fabrication.

SUMMARY OF THE INVENTION

The present invention thus provides a semiconductor memory device comprising: a substrate on which a memory cell array portion and a peripheral circuit portion for the memory cell array portion are provided, the surface of said memory cell array portion being higher in level than the surface of said peripheral circuit portion; a glass layer formed on said peripheral circuit portion, the glass layer having a predetermined thickness for offsetting the difference in level between the surface of said memory cell array portion and that of said peripheral circuit portion, so as to provide a substantially even surface over said memory cell array portion and peripheral circuit portion and a metal wiring for said memory cell array portion and peripheral circuit portion, which is formed in a predetermined pattern on the substantially even surface.

The present invention employs a process that, instead of forming a hollow portion in the substrate for the memory cell array portion, the level o the peripheral circuit portion is virtually raised to provide the even surface prior to the step of metal wiring. Specifically, in a semiconductor memory device of the present invention comprising the memory cell array portion and the peripheral circuit portion, a dummy pattern of a glass layer is provided on the foregoing peripheral circuit portion so as to reduce the difference in level between the foregoing memory cell array portion and peripheral circuit portion.

DETAILED DESCRIPTION OF THE PREFERRED EMBODIMENTS

Figure 1:
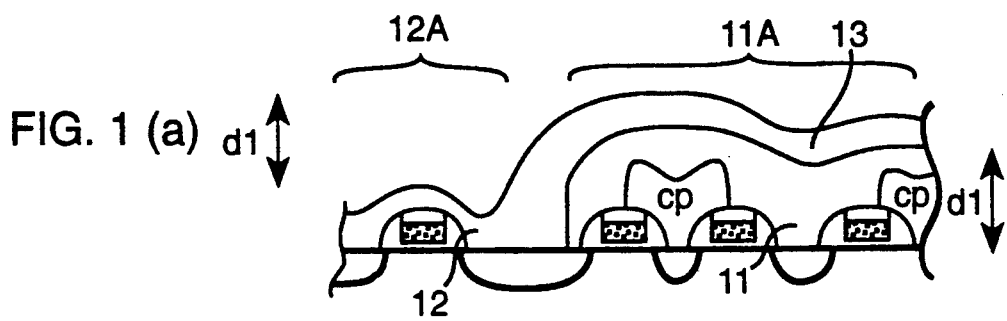
FIGS. 1A–1E illustrate the fabrication process of a semiconductor memory device according to the present invention.
Figure 1:
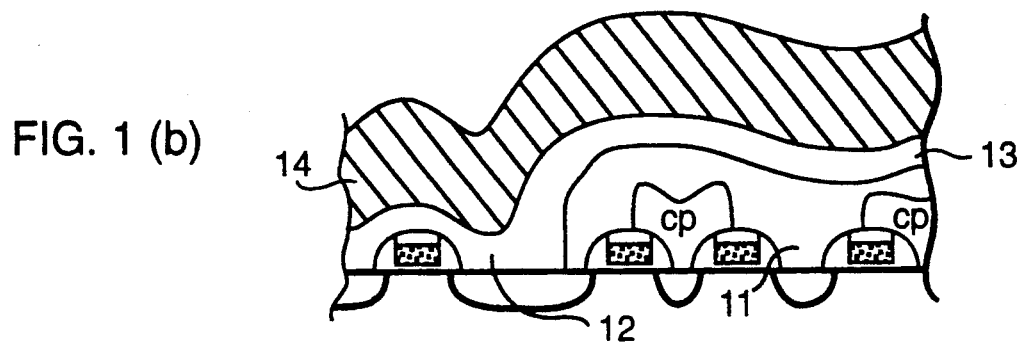
Figure 1:
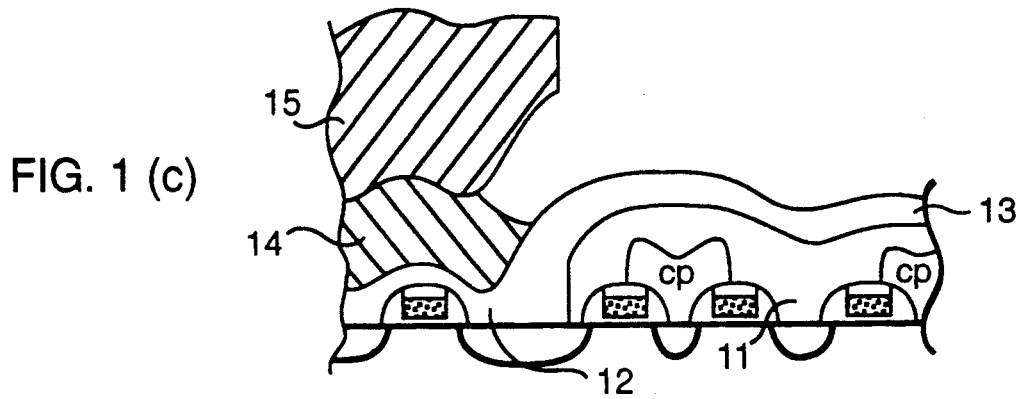
Figure 1:
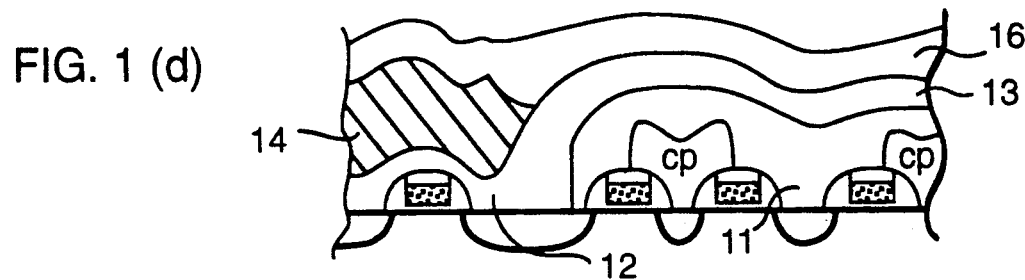
Figure 1:
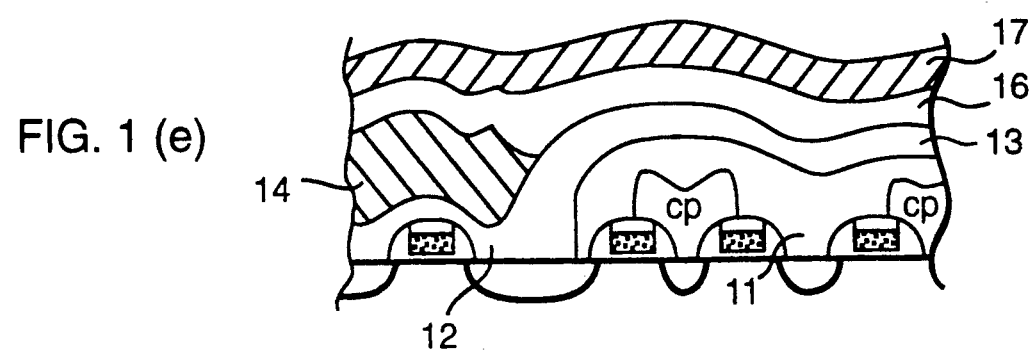
Figure 2:
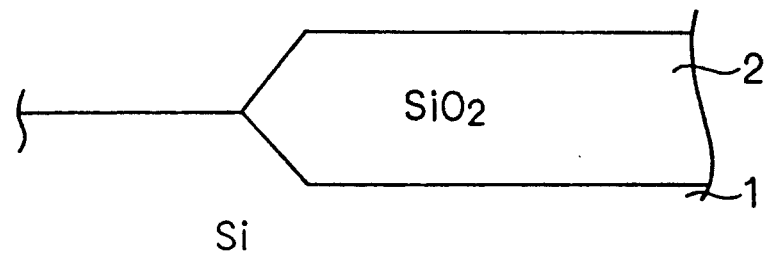
FIGS. 2A–2D illustrate the fabrication process of a conventional semiconductor memory device.
Figure 2:
Figure 2:
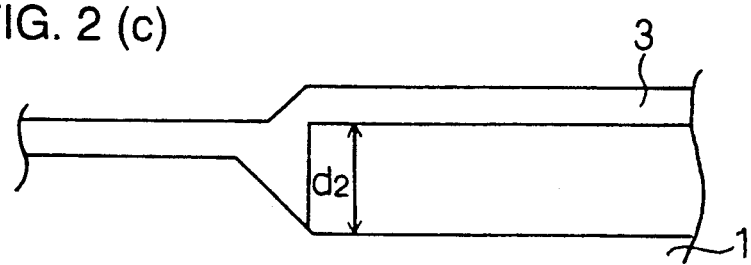
Figure 2:
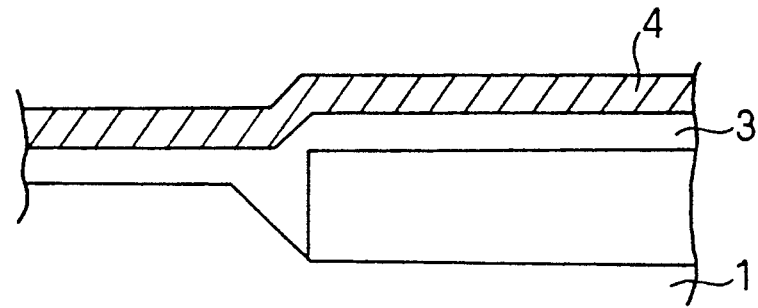

The semiconductor memory device of the present invention may be fabricated in the following process;

(a) First, a memory cell array and a peripheral circuit are formed in predetermined regions on the substrate of silicon or the like, in accordance with a conventional procedure. In terms of the object of the present invention, the memory cell array is preferably of three dimensional structure having a plurality of memory cell layers composed of DRAMs, SRAMs, PROMs, EPROMs or the like. However, the memory cell structure is not limited thereto, and it is also possible to use other types of memory cell array that may form a great difference in level with the peripheral circuit portion. The peripheral circuit may include transistor units and their associated units constituting the decoder, the sense amplifier, the input-output buffer and the like for the memory cell array.

(b) Then, an insulating layer (so-called "inter-layered dielectric") is formed on the above-mentioned memory cell array and peripheral circuit, so as to provide the memory cell array portion and the peripheral circuit portion of the present invention. The insulating layer may be composed of a typical glass such as BPSG (Boron-Phosphorus Silicate Glass) or PGS (Phosphorus silicate Glass). However, BPSG is preferred. The preferred thickness of the insulating layer is about 0.4 to 0.6 $\mu m$.

The structure of the present invention is particularly effective when the difference in level between the top surface of the memory cell array portion and the top surface of the peripheral circuit portion, both of which comprise the coating of the insulating layer, is 0.4 $\mu m$ or more, typically in the range of 0.4 to 1.5 $\mu m$.

(c) Subsequently, a glass layer is deposited both on the memory cell array portion and on the peripheral circuit portion. The glass layer is for offsetting the difference in level formed therebetween. The thickness of the glass layer is made approximately equal to the foregoing difference in level between the memory cell array portion and the peripheral circuit portion. The glass layer is composed of a glass with a higher etching rate than that of the foregoing insulating layer with respect to an etchant described below. For example, when the foregoing insulating layer is composed of BPSG, the glass layer for offsetting the difference in level is composed of PSG.

(d) After the deposition of the foregoing glass layer, a resist layer for etching is formed on the region of the glass layer placed on the peripheral circuit portion, so as to serve as a mask in etching for removing the part of the glass layer on the memory cell array portion. In this case, it is suitable to conduct isotropic etching, in which wet etching using a solution of HF and/or $NH_4F$ is preferably involved. The isotropic etching enables the side etching of the edge portion of the glass layer on the peripheral circuit portion covered with the resist, so that it is effective in providing a substantially even surface.

After etching is completed, the glass layer remains on the foregoing peripheral portion to offset the difference in level between the memory cell array portion and the peripheral circuit portion, so that the glass layer on the peripheral circuit portion is substantially flush with the memory cell array portion, thus providing the even surface.

(e) The metal wiring is then formed in a predetermined pattern on the foregoing even surface, in accordance with the well-known procedure. Typically, the surface is coated with an insulating protective layer of $CVD$-$SiO_2$ and the like (with a thickness of 0.4 to 9.9 $\mu m$), followed by the formation of contact holes in the protective layer. After that, a metal such as Al, Al-Si, Si, W, or WTi is deposited thereon by vapor deposition or CVD, followed by photoetching to develop a pattern, thereby accomplishing the provision of the metal wiring.

EXAMPLE

The present invention will e described below in detail with reference to the example.

As shown in FIG. 1A, the semiconductor memory device of the present invention is fabricated in accordance with the conventional process before the wiring step. The drawing shows the main portion of a RAM cell array 11 having four RAM layers, the main portion of a peripheral circuit 12, the difference in level $d_1$ resulting from the RAM cell array of three dimensional structure, and an insulating layer 13 of BPSG. Next, a layer 14 of PSG (the glass layer of the present invention) is formed so the the thickness thereof coincides with the difference in level ($d_1$) between the RAM cell array portion 11A and the peripheral circuit portion 12A (1.0 to 1.5 $\mu m$).

In this example, the BPSG layer 13 was made of BPSG containing 3.8 wt% of boron and 3.2 mole% of phosphorus, which had been prepared by CVD method, followed by baking at 900° C. for 20 minutes, while the PSG layer 14 was made of a PSG containing 7 mole% of phosphorus, which had been prepared by CVD method, followed by baking at 700° C. for 20 minutes.

A photoresist 15 is then applied to the surface of the PSG layer, exposed, and developed prior to etching with the use of an etchant of buffered hydrofluoric acid.

The etchant used in this example was that prepared by mixing a 50 wt% HF and 40 wt% $NH_4F$ at a ratio of 1 to 10. The temperature of the etchant was approximately 30° C.

In this case, the etching rate of PSG with respect to the foregoing etchant is about 7 times higher than the etching rae of BPSG (BPSG 900 Å/min; PSG 6000 Å/min). Hence, the BPSG layer 13 can be utilized as a kind of etching stopper in the RAM cell array portion. Consequently, even when etching is conducted in excess, the BPSG layer 13 of the RAM cell array portion is not substantially thinned, thus providing the substantially even configuration as shown in FIG. 1C. After the resist 15 is removed, a layer 16 of $SiO_2$ is deposited by bias ECRCVD to eliminate the slightest difference in level in the marginal area and to realize the planar surface, the configuration of which is shown in FIG. 1D. Thereafter, metal wiring 17 is formed in accordance with the typical procedure, as shown in FIG. 1E.

In the semiconductor memory device of the present invention thus constituted, the substantially even surface is obtained over the peripheral circuit portion and the memory cell array portion, so that the metal wiring can smoothly be provided thereon without incurring the breaking of a wire or the narrowing of the width of a wire, thus providing a semiconductor memory device with high reliability. Besides, since a hollow portion is not formed in the substrate by removing a part thereof, stress and other undesirable conditions do not develop in the substrate.

What we claimed is:

1. A method of forming a semiconductor memory device having a substantially even surface, said method comprising:

forming a memory cell array portion and a peripheral circuit portion on a semiconductor substrate wherein the height of the surface of said memory cell array portion above the substrate exceeds that of said peripheral circuit portion;

forming a first insulating film of a material having a first etching rate on the surfaces of said memory cell array portion and said peripheral circuit portion;

forming a glass layer on the entire surface of said first insulating layer, said glass layer having a second etching rate and having a predetermined thickness sufficient to offset the difference in surface heights of said memory cell array and peripheral circuit portions;

isotropically etching said glass layer to remove that portion of said glass layer formed on the said memory cell array portion so that the surface heights of said glass layer and said first insulating layer formed on said memory cell array portion are substantially flush with each other; and forming a metal wiring for said memory cell array portion and said peripheral circuit portion on said substantially flush surfaces.

2. A method as in claim 1 wherein said second etching rate is higher than said first etching rate.

3. A method as in claim 1 wherein said isotropic etching is performed by wet etching with a buffered hydrofluoric acid.

4. A method as in claim 1 further including the step of:

forming a second insulating layer on said glass layer and said first insulting layer covering said memory cell array portion prior to forming the metal wiring.